United States Patent
Khondker et al.

(10) Patent No.: US 6,891,417 B2
(45) Date of Patent: May 10, 2005

(54) CIRCUITS AND METHODS FOR ALIGNMENT OF SIGNALS IN INTEGRATED CIRCUITS

(75) Inventors: Tanveer R Khondker, Folsom, CA (US); Vijay Vuppaladadium, Folsom, CA (US); Inder Sodhi, Folsom, CA (US); Venkatesh Prasanna, Folsom, CA (US); Kedar Mangrulkar, Folsom, CA (US); Miguel Corvacho, Heredia (CR); Nakul Arora, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/612,722

(22) Filed: Jul. 2, 2003

(65) Prior Publication Data

US 2005/0001664 A1 Jan. 6, 2005

(51) Int. Cl.$^7$ .................................................. H03K 5/01
(52) U.S. Cl. .......................... 327/165; 327/162; 375/293
(58) Field of Search ................................ 327/162, 163, 327/165–167, 147, 156, 291, 295–299, 116; 375/376, 293, 294

(56) References Cited

U.S. PATENT DOCUMENTS

| | | | | | |
|---|---|---|---|---|---|
| 5,596,614 A | * | 1/1997 | Ledda | ......................... | 375/376 |
| 5,710,517 A | * | 1/1998 | Meyer | ......................... | 327/163 |
| 5,748,569 A | * | 5/1998 | Teodorescu et al. | ......... | 368/118 |
| 6,104,228 A | * | 8/2000 | Lakshmikumar | ............ | 327/407 |
| 6,259,467 B1 | * | 7/2001 | Hanna | ......................... | 347/249 |
| 6,333,653 B1 | * | 12/2001 | Floyd et al. | ................. | 327/163 |
| 6,756,827 B2 | * | 6/2004 | Konuk et al. | ................ | 327/116 |

* cited by examiner

Primary Examiner—Minh Nguyen
(74) Attorney, Agent, or Firm—Schwegman, Lundberg, Woessner & Kluth, P.A.

(57) ABSTRACT

Circuits and methods align an internal signal with an external signal. A phase lock loop network receives the external signal to generate phase lock loop signals. A programmable ratio decoder provides a code. An alignment unit generates the internal signal based on at least one of the phase lock loop signals. The alignment unit aligns internal signal with the external signal based on the code.

29 Claims, 13 Drawing Sheets

CIRCUITS AND METHODS FOR ALIGNMENT OF SIGNALS IN INTEGRATED CIRCUITS

FIELD

Embodiments of the present invention relate generally to signal distribution in integrated circuits, and more particularly to signal alignment.

BACKGROUND

Integrated circuits such as microprocessors reside in many computers and electronic devices. A typical integrated circuit has many components.

The components usually communicate with each other based on a reference signal. The reference signal is usually distributed to the components from a main location. For a reliable communication, most integrated circuits have a controller to ensure accuracy in distribution of the reference signal.

As integrated circuits become more complex, accurate distribution of the reference signal becomes harder.

DESCRIPTION OF EMBODIMENTS

Figure 1:
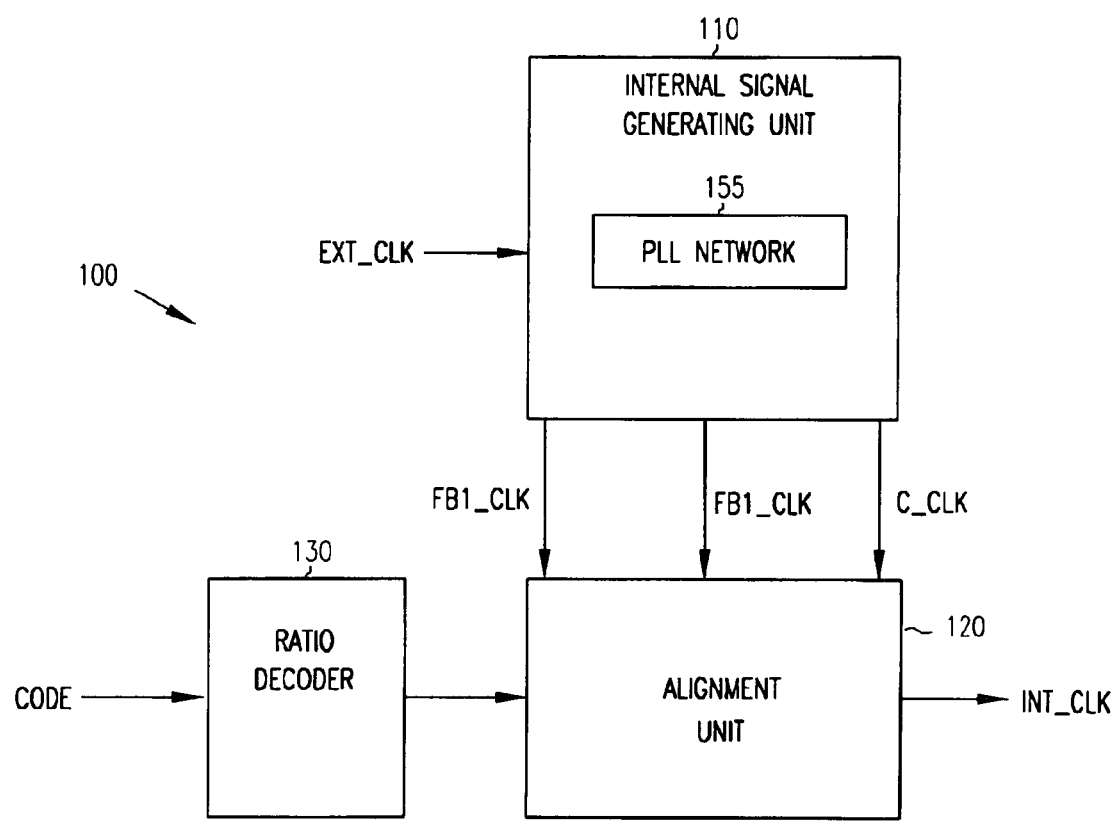
FIG. 1 shows a signal generator.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows a signal generator 100 including an internal signal generating unit 110, an alignment unit 120, and a ratio decoder 130. Internal signal generating unit 110 includes a phase lock loop (PLL) network 111. PLL network 111 receives an external signal EXT_CLK and generates a number of PLL signals including a core signal C_CLK, and feedback signals FB_CLK and FB1_CLK. Alignment unit 120 uses one or more of the PLL signals to generate an internal signal INT_CLK. Ratio decoder 130 receives a code signal CODE. Based on the CODE signal, Alignment unit 120 synchronizes the INT_CLK and EXT_CLK signals.

In some embodiments, alignment unit 120 synchronizes the INT_CLK and EXT_CLK signals by aligning edges of the INT_CLK signal with corresponding edges of the EXT_CLK signal. For example, alignment unit 120 aligns the rising edges of the INT_CLK signal with the rising edges of the EXT_CLK signal.

Figure 2:
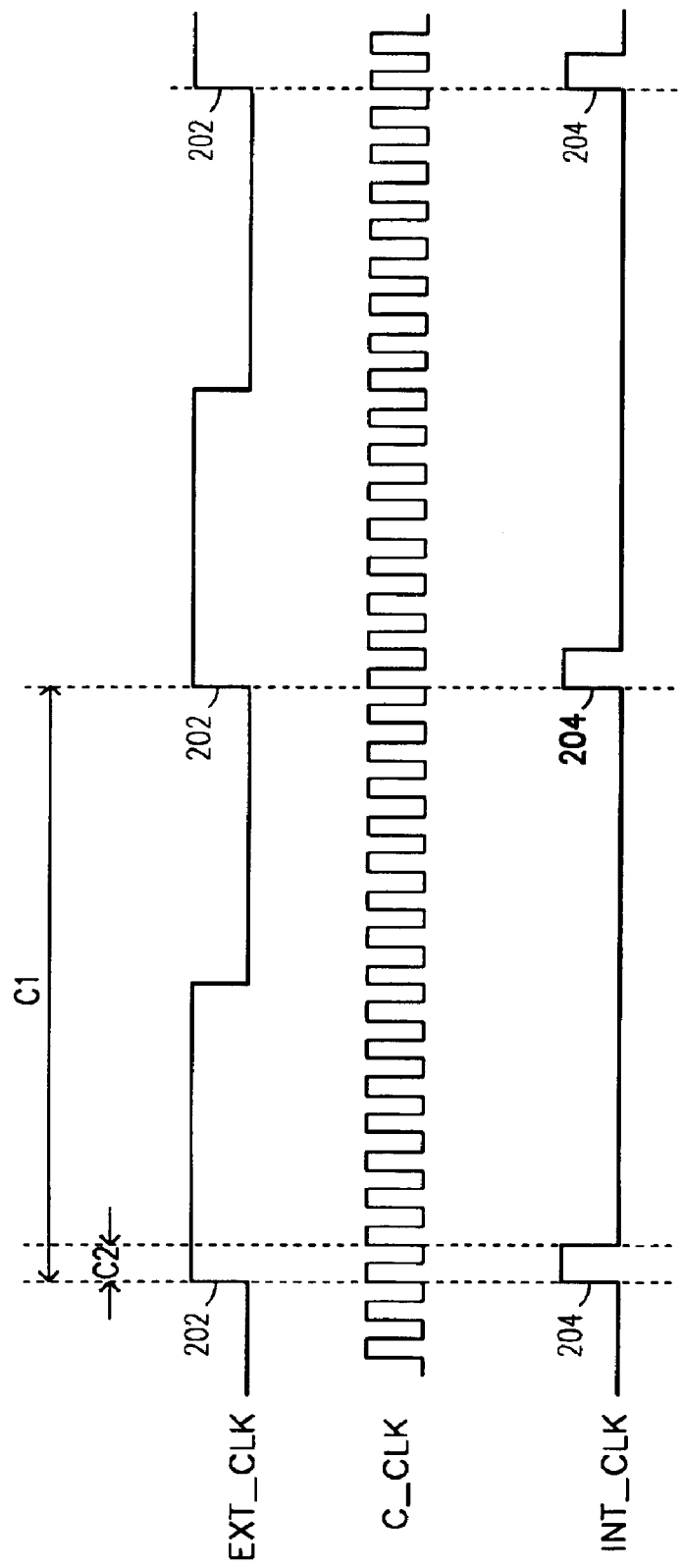
FIG. 2 is an exemplary timing diagram for the signal generator.

FIG. 2 is an exemplary timing diagram for signal generator 100 of FIG. 1. In FIG. 2, C1 and C2 indicate cycle times (or cycles). As shown in FIG. 2, the EXT_CLK and INT_CLK signals have equal cycle time but different pulse widths. There are multiple cycles of the C_CLK signal within one cycle of the EXT_CLK signal. Thus, the C_CLK signal has a higher frequency than the EXT_CLK and INT_CLK signals. The EXT_CLK and INT_CLK signals are synchronized such that each of the rising edges 202 of the EXT_CLK signal is aligned with a corresponding rising edge 204 of INT_CLK signal.

In this description, aligned and synchronized are used interchangeably. When a first signal is indicated as aligned (synchronized) with a second signal, a reference edge (for example the rising edge) of the first signal is aligned with a corresponding reference edge (the rising edge) of the second signal. In some embodiments, a certain margin of allowable error allows for the first signal to be aligned with the second signal even if there is a certain skew (offset) between the first and second signals.

In some embodiments, the margin of allowable error is measured by the cycle of a core signal such as the C_CLK signal. In FIG. 2, for example, a margin of allowable error may be up to two cycles of the C_CLK signal. Thus, in some embodiments, using the margin of allowable error of two cycles of the C_CLK signal as an example, the INT_CLK and EXT_CLK signals are aligned as long as the corresponding edges of the INT_CLK and EXT_CLK signals are within two cycles of the C_CLK signal.

Figure 3:
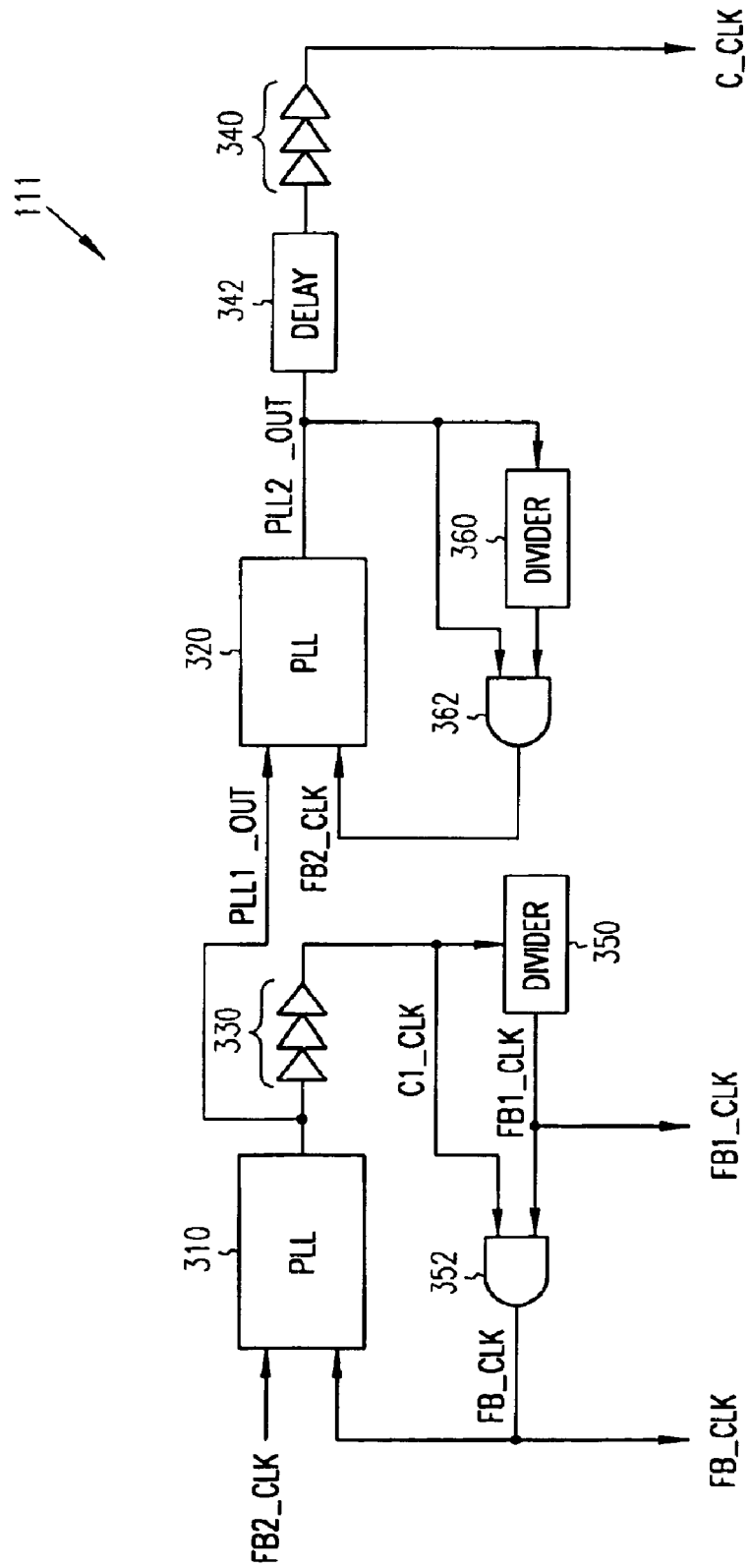
FIG. 3 is a circuit diagram of a PLL network.

FIG. 3 is a circuit diagram of the PLL network 111 of FIG. 1. PLL network 111 includes a first PLL 310 and a second PLL 320 coupled in a cascaded configuration. PLL network 111 uses PLL 310 and PLL 320 to generate multiple core signals based on the EXT_CLK. For example, PLL 310 is used to generate a core signal C1_CLK and PLL 320 is used to generate core signal C_CLK.

PLL 310 and PLL 320 and other components such as dividers 350, 360 and logic gates 352 and 362 operate to adjust any phase difference between the signals at the input nodes of each of the PLL 310 and 320 to synchronize the signals at the input nodes. The PLL is locked when the signals at its input nodes are synchronized. For example, when the EXT_CLK and FB_CLK signals are synchronized, PLL 310 is locked. When the PLL is locked, the core signal associated with the locked PLL is stabilized. Thus, the core signals C_CLK and C1_CLK are stabilized when PLL 310 and PLL 320 are locked.

PLL network 111 sends the C_CLK and C1_CLK signals to other components for use as clock signals. In some embodiments, PLL 310 and PLL 320 and dividers 350 and 360 are constructed such that each of the C_CLK and C1_CLK signals has a higher frequency than the EXT_CLK signal. In some embodiments, the C_CLK signal has a higher frequency than the C1_CLK signal. In these embodiments, the C_CLK signal may be sent to components operating at a higher frequency and the C1_CLK signal may be sent to components operating at a lower frequency.

PLL network 111 includes a distribution 330 coupled to PLL 310 and a distribution 340 coupled to PLL 320. Distribution 330 represents a model of circuit components between PLL 310 and other locations (distribution points) to which the C1_CLK signal is distributed. Distribution 330 may include circuit elements that introduce a delay to a signal. Similarly, distribution 340 represents a model of circuit components between PLL 320 and locations to which the C_CLK signal is distributed. PLL network 111 also includes a delay unit 342 to allow better matching between distributions 330 and 340 to reduce signal noise that may be introduced to PLL network 111. In some embodiments, delay unit 342 is omitted.

Each of the PLL 310 and 320 has a PLL output signal. PLL 310 has a PLL output signal PLL1_OUT. PLL 320 has a PLL output signal PLL2_OUT. Each of the PLL 310 and PLL 320 has a PLL feedback path. The PLL feedback path of PLL 310 includes distribution 330, divider 350, and gate 352. The PLL feedback path of PLL 320 includes divider 360 and gate 362. Delay unit 342 and distribution 340 are omitted from the feedback path of PLL 320.

PLL 310 uses the core signal C1_CLK in its feedback path to synchronize the EXT_CLK and FB_CLK signal at the input nodes of PLL 310.

PLL 320 uses the PLL2_OUT signal in its feedback path to synchronize the PLL1_OUT signal and FB2_CLK signals at the input nodes of PLL 320. The core signal C_CLK is not used in the feedback path of PLL 320.

Since PLL 320 uses the PLL output signal PLL1_OUT instead of the C1_CLK signal, any signal noise associated with distribution 330 is less likely to be introduced into PLL 320. Further, since PLL 320 uses the PLL2_OUT signal, instead of the C_CLK signal, in its feedback path, signal noise from distribution 340 is also less likely to be introduced into PLL 320.

As shown in FIG. 3, since PLL 320 does not use the C_CLK signal as a feedback signal, signal jitter introduced to PLL 320 from the distribution network may be reduced.

Figure 4:
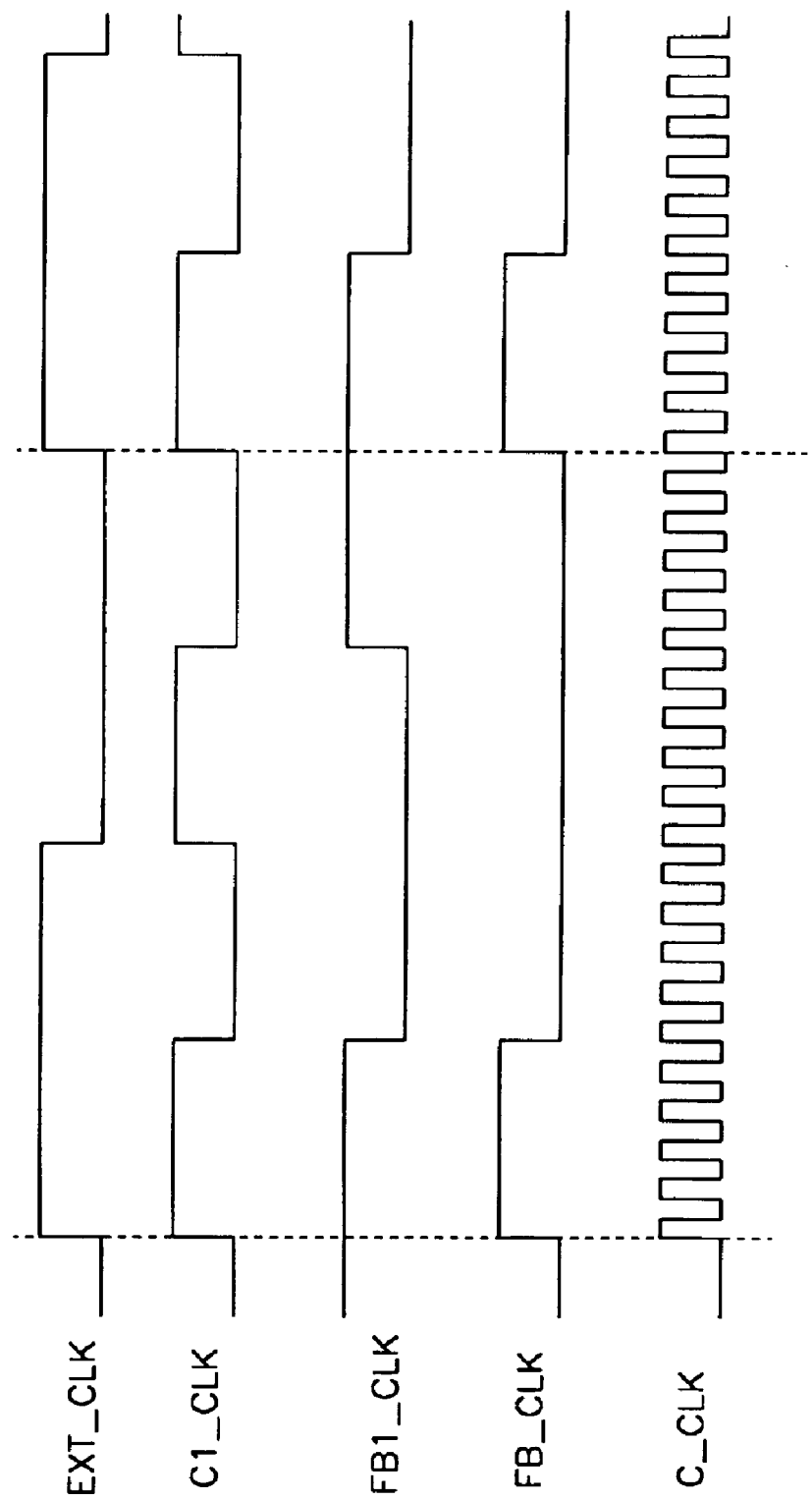
FIG. 4 is an exemplary timing diagram for the PLL network.

FIG. 4 is an exemplary timing diagram for PLL network 111 of FIG. 3. The C1_CLK signal has a higher frequency than the EXT_CLK signal. The EXT_CLK, FB_CLK, and FB1_CLK signals have equal frequency but with different duty cycles. Thus, each of the FB_CLK and FB1_CLK signals is a modified version of the EXT_CLK signal. The C_CLK signal has a higher frequency than the EXT_CLK signal.

Figure 5:
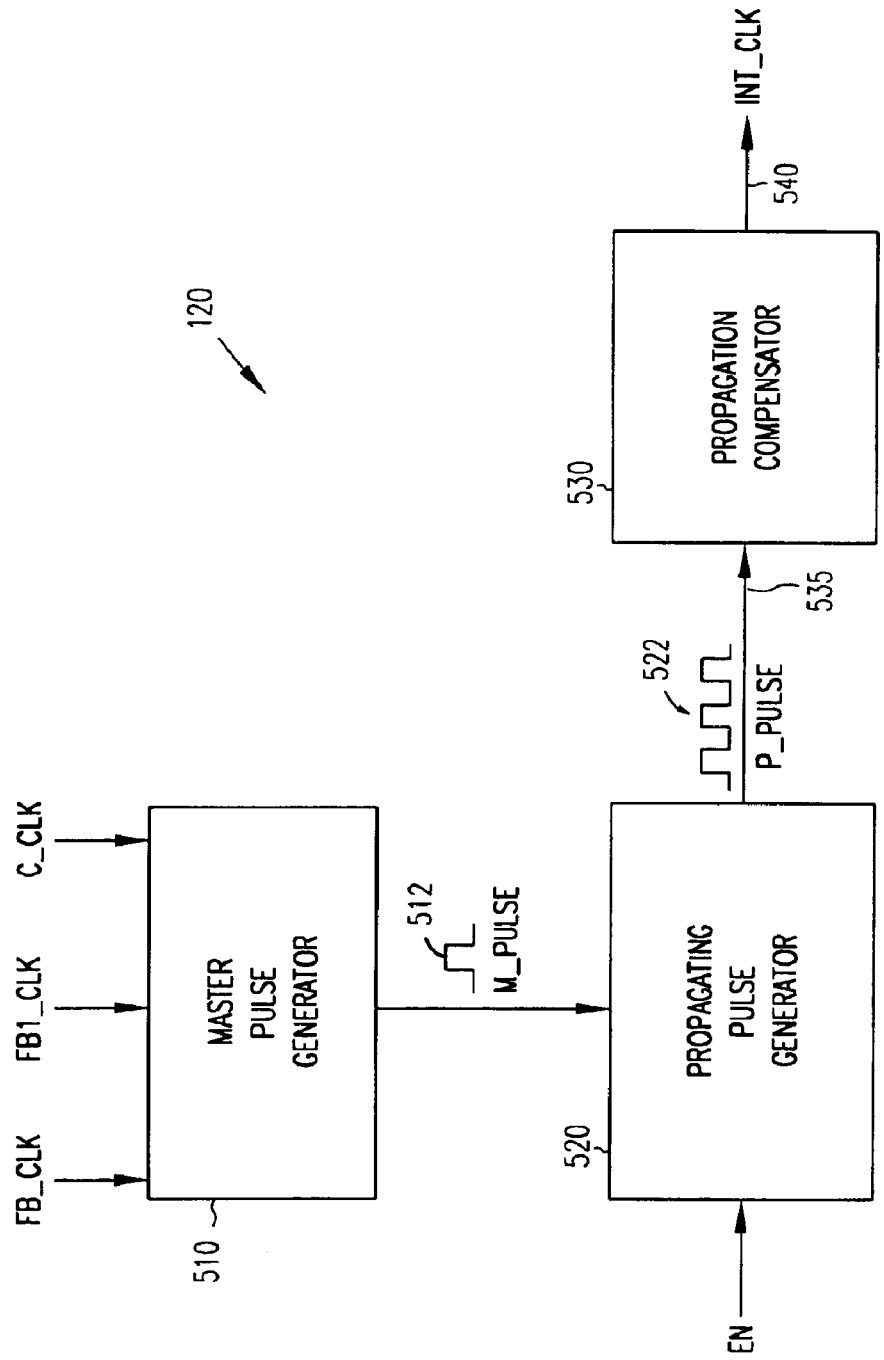
FIG. 5 is a circuit diagram of an alignment unit.

FIG. 5 is a circuit diagram of alignment unit 120 of FIG. 1. Alignment unit 120 uses one or more of the signals generated by PLL network 111 (FIG. 3) to generate the INT_CLK signal that is synchronized with the EXT_CLK signal. Alignment unit 120 includes a master pulse generator 510, a propagation pulse generator 520, and propagation compensator 530.

Master pulse generator 510 generates a master pulse (M_PULSE) 512 based on the FB_CLK, FB1_CLK, and C_CLK signal generated by PLL network 111 (FIG. 3).

Propagation pulse generator 520 generates a number of propagation pulses (P_PULSE) 522 based on master pulse 512. Propagation pulses 522 are generated at certain intervals based a control signal EN. Ratio decoder 130 (FIG. 1) provides the EN signal based on the CODE signal. Details of ratio decoder 130 are described in subsequent section.

Propagation compensator 530 has an output node 540 and an input node 535 (which is also the output node of propagation pulse generator 520). Propagation compensator 530 outputs the internal signal INT_CLK based on the propagation pulses 522. The INT_CLK signal is synchronized with the EXT_CLK signal at output node 540. In some embodiments, output node 540 represents a distribution point at which a certain component is coupled to receive the INT_CLK signal in which the INT_CLK and the EXT_CLK signals are aligned.

Since distribution 340 and the C_CLK signal are outside of the feedback path of PLL 320, using alignment unit 120 to align the INT_CLK signal with the EXT_CLK signal provides flexibility in distribution of the INT_CLK signal.

Figure 6:
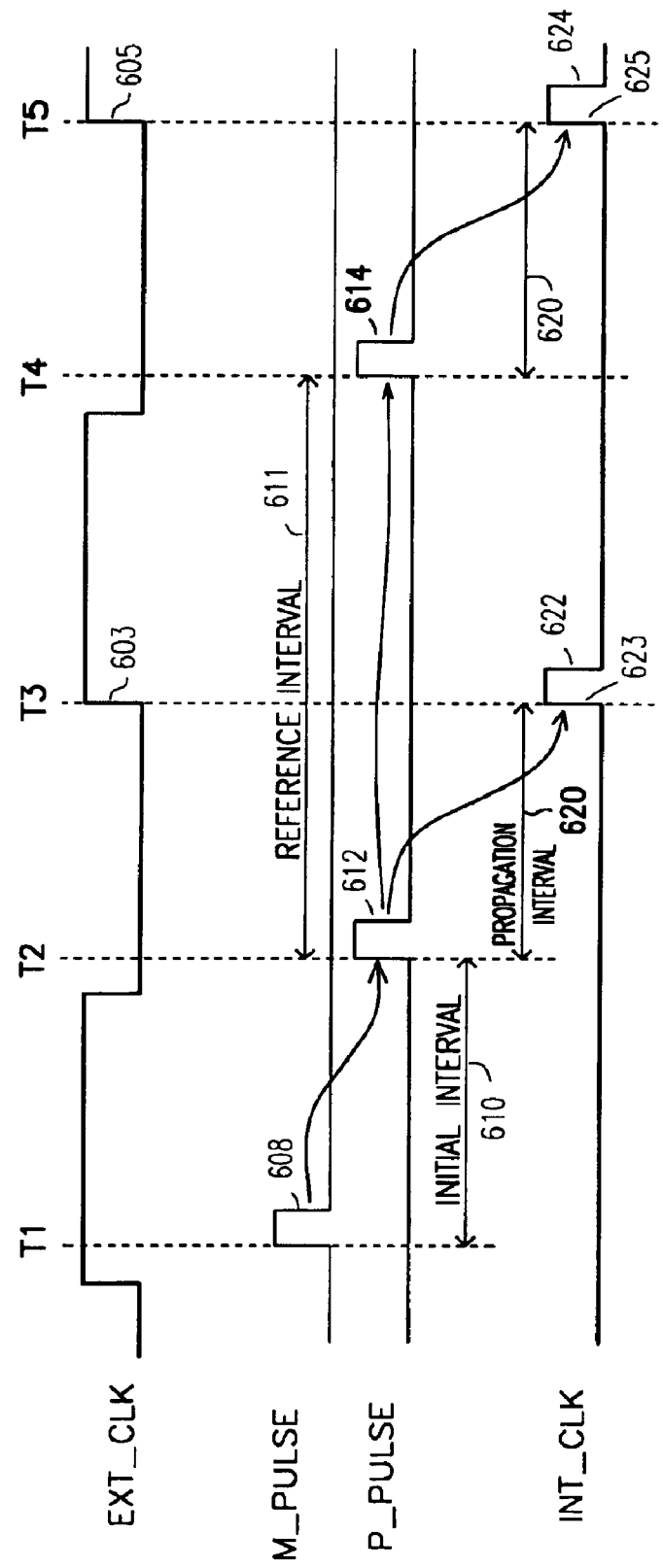
FIG. 6 is an exemplary timing diagram for the alignment unit.

FIG. 6 is an exemplary timing diagram for alignment unit 120 of FIG. 5. In FIG. 6, T1 through T5 are exemplary times. Edge 603 at time T3 and edge 605 at time T5 are anticipated edges of the EXT_CLK signal. The interval 610 between times T1 and T2 is referred to as an initial interval 610. The interval 611 between times T2 and T4 is referred to as a reference interval 611. The interval 620 between times T2 and T3 (also between T4 and T5) is referred to as a propagation interval 620.

At time T1, the master pulse (M_PULSE) 608 is generated. No other master pulse is generated after pulse 608 is generated.

At time T2, a first propagation pulse 612 is generated. Since the interval 610 between times T1 and T2 is referred to as the initial interval, the first propagation pulse 612 is generated at the initial interval after the master pulse 608 is generated.

At time T3, pulse 622 of the INT_CLK signal is generated. In FIG. 5, pulse 622 is generated at output node 540 by propagation compensator 530. In some embodiments, propagation compensator 530 generates pulse 622 by propagating pulse 612 from input node 535 at time T2 to output node 540 at time T3. Since the interval 620 between times T2 and T3 is referred to as the propagation interval, in some embodiments, pulse 622 of the INT_CLK signal is generated by propagating pulse 612 of the P_PULSE for the propagation interval. At time T3, edge 623 of pulse 622 is aligned with anticipated edge 603 of the EXT_CLK signal.

At time T4, a subsequent propagation pulse 614 is generated. Since the interval 611 between times T2 and T4 is referred to as the reference interval, the subsequent propagation pulse 614 is generated at the reference interval after the first propagation pulse 612 is generated.

At time T5, pulse 624 of the INT_CLK signal is generated. In FIG. 5, pulse 624 is generated at output node 540 by propagation compensator 530. In some embodiments, propagation compensator 530 generates pulse 624 by propagating pulse 614 from input node 535 at time T4 to output node 540 at time T5. Since the interval 620 between times T4 and T5 is also referred to as the propagation interval, in some embodiments, pulse 624 of the INT_CLK signal is generated by propagating pulse 614 of the P_PULSE for the propagation interval. At time T5, edge 625 of pulse 624 is aligned with anticipated edge 605 of the EXT_CLK signal.

In some embodiments, initial interval 610 and reference interval 611 are not equal. For example, reference interval 611 may be greater than reference interval 610 based on certain measuring units.

In some embodiments, the measuring units are the numbers of the cycles of the C_CLK signal. In these embodiments, the initial interval 610 and reference interval 611 may have unequal numbers of cycles of the C_CLK signal. For example, reference interval 611 may have greater number of cycles of the C_CLK than initial interval 610.

In some embodiments, the value of initial interval 610 is a variable (not fixed) value with reference to a core to bus ratio. The value of reference interval 611 is a fixed (not variable) value with reference to the core to bus ratio. The core to bus ratio is the number of cycles of the C_CLK signal within one cycle of the EXT_CLK signal. The core to bus ratio may be selected by the CODE signal (FIG. 1) during a process, for example, during programming process. Thus, in some embodiments, when the core to bus ratio is changed, the value of initial interval 610 is changed while the value of reference interval 611 is unchanged. In some embodiments, the value of initial interval 610 and the value of reference interval 611 are certain numbers of the cycles of the C_CLK signals.

In some embodiments, the value of propagation interval 620 is a fixed value with reference to the core to bus ratio. Thus, in some embodiments, when the core to bus ratio is changed, the value of propagation interval 620 is unchanged.

Figure 7:
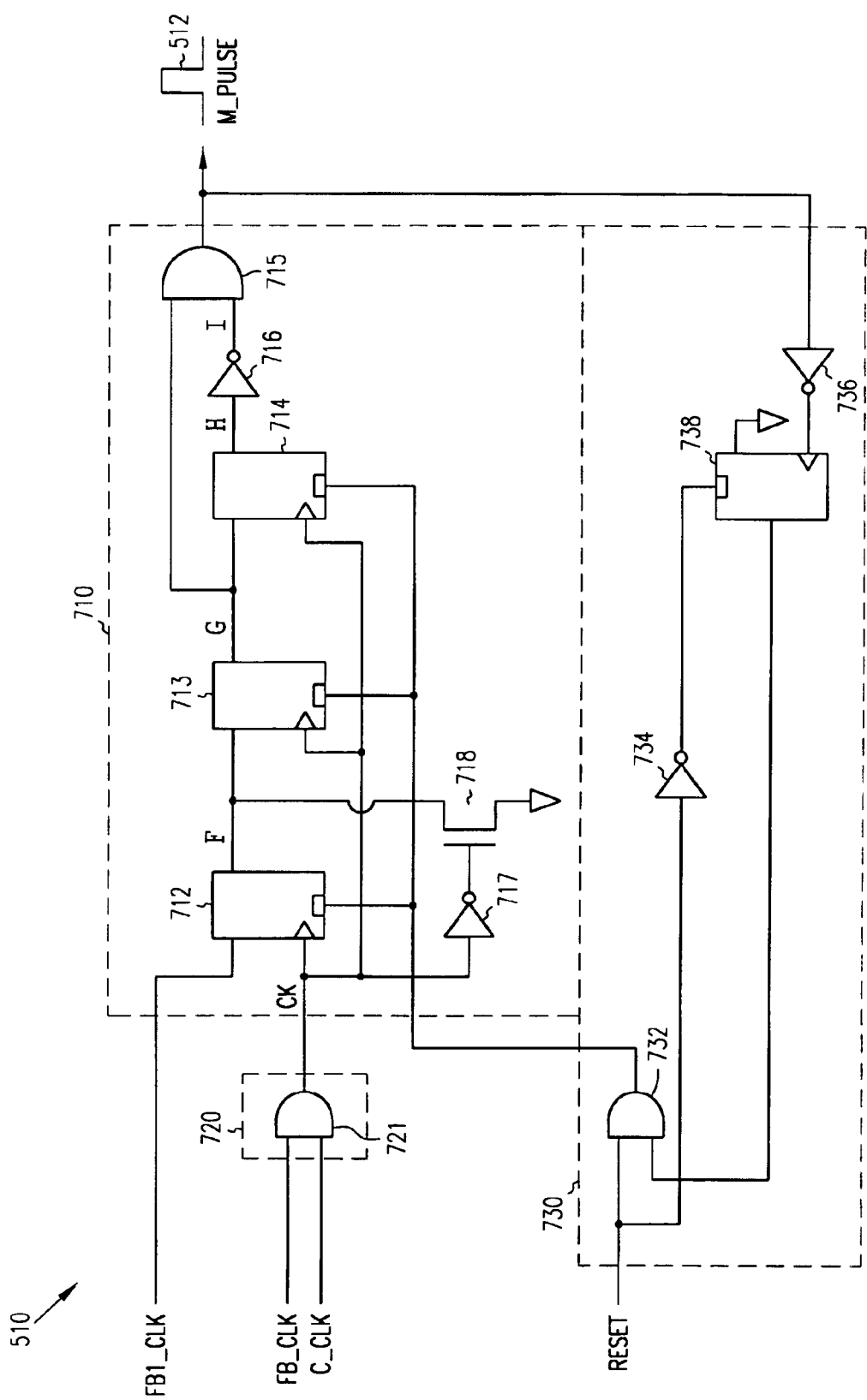
FIG. 7 is circuit diagram of a master pulse generator.

FIG. 7 is a circuit diagram of master pulse generator 510 of FIG. 5. Master pulse generator 510 receives the C_CLK, FB_CLK, and FB1_CLK signals (FIG. 3) and generates the master pulse (M_PULSE) 512 at an output node 702. Master pulse generator 510 includes a logic unit 710, an enable unit 720, and a reset unit 730. Logic unit 710 includes flip flops 712, 713, and 714, AND gate 715, invertors 716 and 717, and transistor 718. Enable unit 720 includes an AND gate 721. Reset unit 730 includes AND gate 732, inverters 734 and 736, and flip flop 738.

Reset unit 730 receives a reset signal RESET to reset logic unit 710 such that the signals F, G, H are initially zero (or low) so that the signal (M_PULSE) at output node 702 is initially also zero. Reset unit 730 resets logic unit 710 to a reset mode when the RESET signal goes low during a reset period. Reset unit 730 releases logic unit 710 from the reset mode after the reset period. The RESET signal switches to high after the reset period and remains at high until the next reset period.

Enable unit 720 uses AND gate 732 to logically combine the FB_CLK and the C_CLK signals to provide an enable signal CK. Logic unit 710 uses the CK signal as the clock signal for flip flops 712, 713, and 714 to capture the FB1_CLK signal to generate the master pulse 512.

Transistor 718 prevents flip flops 712, 713, and 714 from a meta-stable state. The meta-stable state is a state when the signal level at an output node of a flip flop is undefined. For example, when the signal level of the output node of the flip flop does not correspond to either a high level or a low level, the signal at the output is at an undefined level causing the flip flop to be in the meta-stable state.

In FIG. 7, flip flop 712 may be in a meta-stable state when the CK signal is a glitch and is weak. A weak glitch may not allow flip flop 712 to capture the FB1_CLK signal, causing the signal (F) to be undefined. Transistor 718 pulls down the F signal to a defined low signal level, thereby preventing the meta-stable state. If the glitch occurs but is not weak, flip flop 712 captures the FB1_CLK signal and the F signal switches to a high level. Transistor 718 is constructed such that when the F signal is at the high level, transistor 718 does not affect the operation of flip flop 712.

Figure 8:
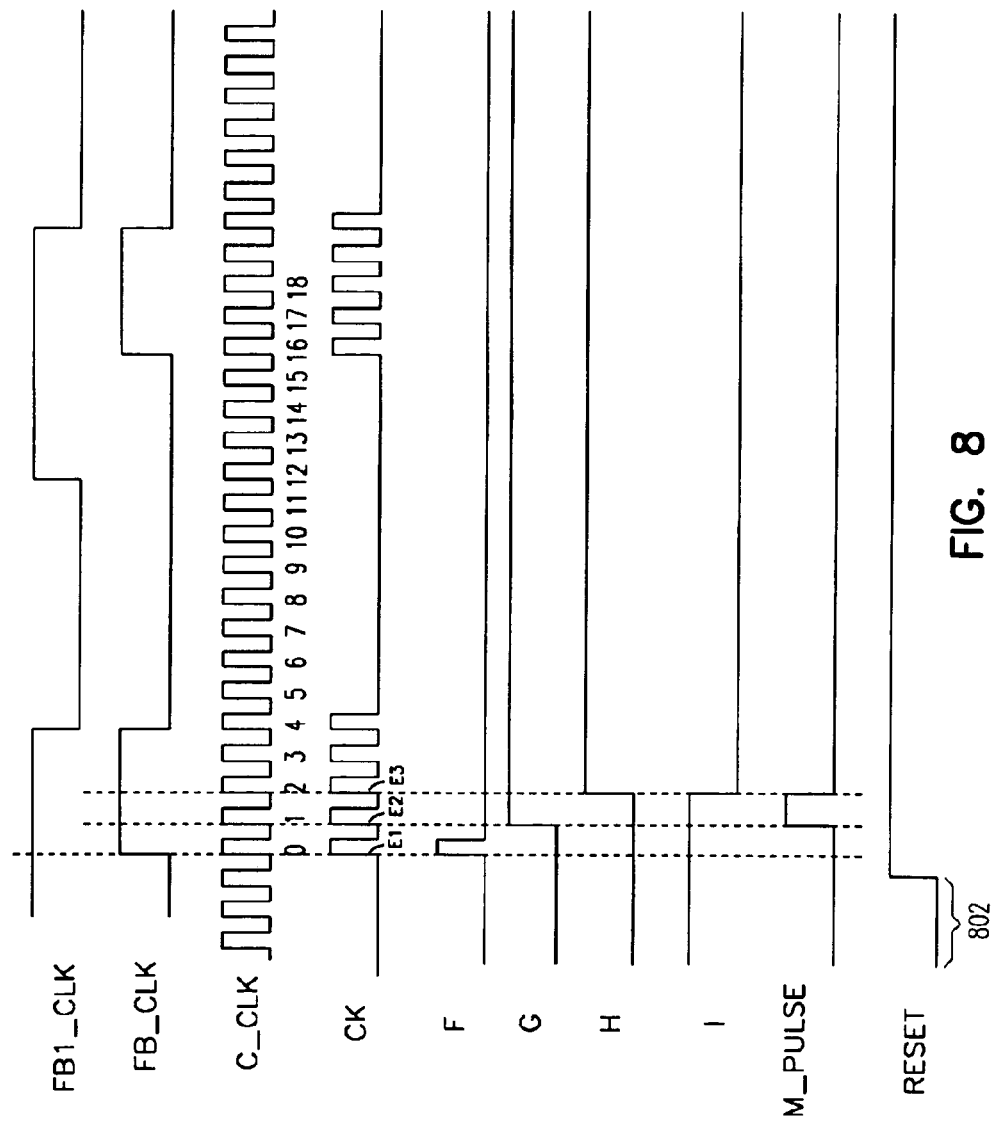
FIG. 8 is an exemplary timing diagram for the master pulse generator.

FIG. 8 is an exemplary timing diagram for master pulse generator 510 of FIG. 7. In FIG. 8, the FB_CLK signal (FIG. 3) is a gated signal generated by a combination of the FB1_FB and the C1_CLK signal. The CK signal has rising edges E1, E2, and E3 as a result of the gated combination (FIG. 7) of the FB_CLK and the C_CLK signal. The E1, E2, and E3 edges cause the F, G, and H signals—the output of the flip flops 712, 713, and 714 respectively—to switch from low to high. The I signal is an inverted version of the G signal. AND gate 715 (FIG. 7) combines the G and I signals to generate the master pulse M_PULSE signal. After the rising edge E3, the M_PULSE signal remains low and does not have another pulse unit after another reset period similar to reset period 802 occurs.

Figure 9:
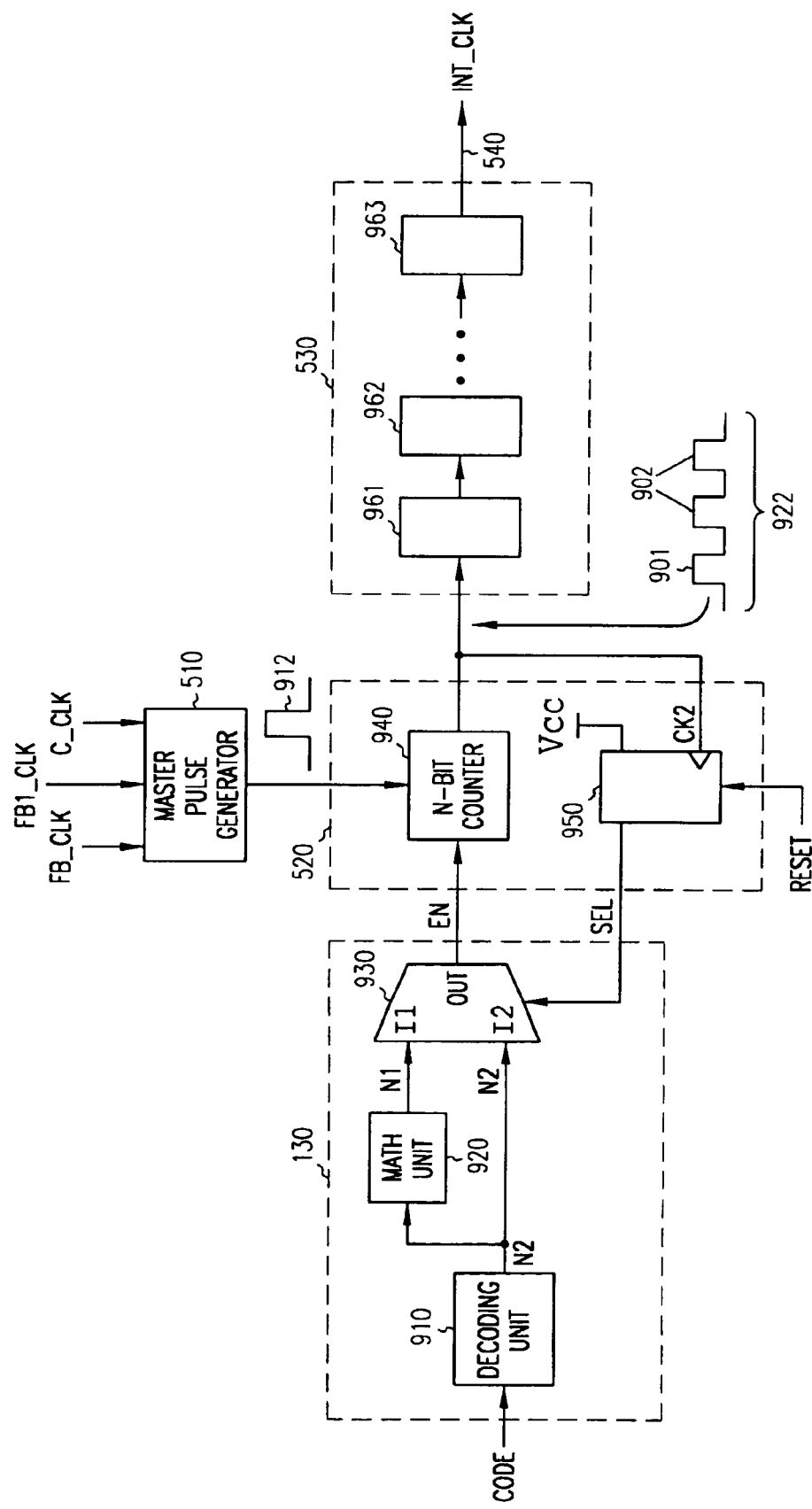
FIG. 9 is a circuit diagram of a ratio decoder and the alignment unit.

FIG. 9 is a circuit diagram of ratio decoder 130 and alignment unit 120 of FIG. 1. Ratio decoder 130 includes a decoding unit 910, a math unit 920, and a selector 930. Propagating pulse generator 520 includes an N-bit counter 940, and a reset element represented by flip flop 950. Propagation compensator 530 includes a number of flip flops 961, 962, and 963 coupled in series between nodes 535 and 540. In FIG. 9, the number of flip flops (three flip flops 961, 962, and 963) is an exemplary number. The number of flips flops may be different from three. The CODE signal, the EN signal, master pulse 912, propagation pulses 922, and internal signal INT_CLK are similar to those of FIG. 5.

In FIG. 9, some of the single lines may include multiple lines. For example, the line that receives the CODE signal may includes multiple lines to receive multiple signals. Math unit 920 includes circuit elements to perform math functions such as subtraction, addition, multiplication, and division. The circuit elements in math unit 920 includes logic circuit. N-bit counter may be an N-bit ring counter.

Ratio decoder 130 receives the code signal CODE to provide the EN. Based on the EN signal, propagation pulse generator 520 and propagation compensator 530 align the INT_CLK and the EXT_CLK signal (FIG. 1). In some embodiments, the CODE signal may be a combination of signals, programming signals, or programming codes that represent a reference a value such as the core to bus ratio. As described previously, the core to bus ratio is the number of cycles of the C_CLK signal within one cycle of the EXT_CLK signal. Thus, the core to bus ratio is a programmable ratio and may be selected. For example, if the number of the cycles of the C_CLK signal within one cycle of the EXT_CLK signal is selected to be 16, then the core to bus ratio is 16. Accordingly, the CODE signal may be programmed to provide a value representing number 16.

Decoding circuit 910 receives the CODE signal and feeds input I2 of selector 930 with a value indicated by N2. Math unit 920 performs a math operation on N2 to obtain N1 and feeds N1 to input I1 of selector 930. N1 and N2 are control values used to control the count of counter 940. N1 is referred to as an initial value (initial interval). N2 is referred to as a reference value (reference interval).

Selector 930 uses a select signal SEL to select one of the values N1 and N2 and provides the selected value to its output OUT. Thus, the EN signal at the output OUT of selector 930 is either N1 or N2. In some embodiments, the SEL signal is initially set such that selector 930 initially EN corresponds to N1.

Counter 940 generates propagation pulses 922 at selected intervals corresponding to the value of either N1 or N2 which is represented by the EN signal. For example, counter 940 may generate a first propagation pulse 901 after a count corresponding to N1. Thus, in this example, N1 corresponds to a first selected interval. As another example, counter 940 may produce a subsequent propagation pulse 902 at a count corresponding to N2 after the first propagation pulse 901 is generated. Thus, in this example, N2 corresponds to second selected interval.

In embodiments represented by FIG. 9, flip flop 950 is set such that the SEL signal selects N1 as the EN signal. Counter 940 generates a first propagation pulse 901 at N1 count after master pulse 912 is generated. When propagation pulse 901 is generated, the CK2 signal causes flip flop 950 to allow the SEL signal to select the N2 to replace N1 as the new value for the EN signal. N2 remains selected until the RESET signal is activated. With N2 being selected, count 940 generates a number of subsequent propagation pulses 902 after the first propagation pulse 901 is generated. Each of the subsequent propagation pulses 902 is generated at a multiple of N2 count after the first propagation pulse 901 is generated.

Thus, N1 is used only once as a count interval between the master pulse 912 and the first propagation pulse 901. N2 is used as a count interval between all of two consecutive pulses among the subsequent propagation pulses 902.

In some embodiments, N2 is the core to bus ratio presented by the CODE signal. The core to bus ratio is the number of cycles of the C_CLK signals within one cycle of the EXT_CLK signal.

N1 is calculated by math circuit 920 based on a certain formula. In some embodiments, the formula is represented by Formula 1 below:

$$N1 = N2 - nF - 1 \quad \text{(Formula 1)}$$

In Formula 1, nF is the number of flip flops of propagation compensator 530. N2 and nF are variables that may be selected.

To select N2 (the frequency of the C_CLK signal with respect to the frequency of the EXT_CLK signal), the CODE signal may be programmed to represent a value corresponding to N2. For example, to select N2 be to equal to 16, an appropriate CODE signal representing 16 may be programmed. In some embodiments, the CODE signal includes a combination of binary code. For example, a combination of binary code 10000 (5 binary bits) may be used to provided to ratio decoder 910 to represent N2=16.

The number of flip flops nF may also be selected such that when the INT_CLK is distributed at a distribution point, the INT_CLK signal is aligned with the EXT_CLK signal. In some embodiments, the number of flip flops is selected based on a measured propagation time. The measured propagation time, for example, is the time it takes for a first signal to propagate from a reference point to a destination point such that at the destination point, the first signal is aligned with a second signal. In some embodiments, the number of flip flop is calculated by dividing the value of the measured propagation time by the time for a signal to propagate through one flip flop. In Formula 1 above, if for example, number of flip flops such as flip flops in propagation compensator 530 is seven, then nF is seven. As another example, if the number of flip flops in propagation compensator 530 is 10, the nF in Formula 1 is 10.

Figure 10:
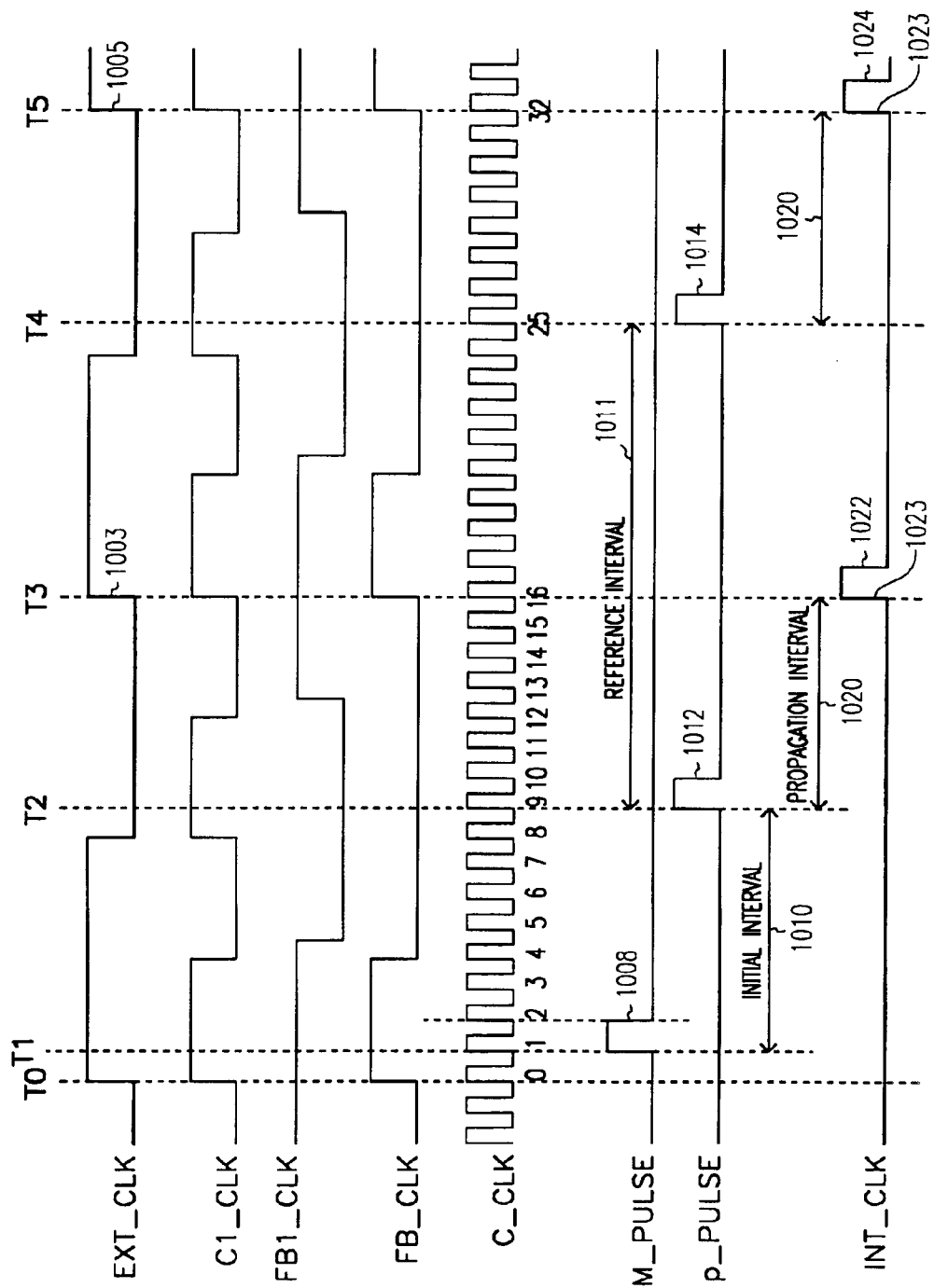
FIG. 10 is an exemplary timing diagram for the ratio decoder and the alignment unit of FIG. 9.

FIG. 10 is an exemplary timing diagram for FIG. 9. In FIG. 10, the core to bus ratio N2 is set at an exemplary number of 16. Thus, the number of the cycles of the C_CLK signal within one cycle of the EXT_CLK signal is 16 (N2=16/1=16). The number of flip flops (nF) in propagation compensator 530 of FIG. 9 is selected at an exemplary number of seven.

Similarly to FIG. 6, in FIG. 10 edge 1003 at time T3 and edge 1005 at time T5 are anticipated edges of the EXT_CLK signal. The interval 1010 between times T1 and T2 is referred to as an initial interval 1010. The interval 1011 between times T2 and T4 is referred to as a reference interval 1011. The interval 1020 between times T2 and T3 (also between T4 and T5) is referred to as a propagation interval 1020.

At time T1, the master pulse (M_PULSE) 1008 is generated. No other master pulse is generated at other times.

At time T2, a first propagation pulse 1012 is generated. Since the interval 1010 between times T1 and T2 is referred to as the initial interval, the first propagation pulse 1012 is generated at the initial interval after the master pulse 1008 is generated.

At time T3, pulse 1022 of the INT_CLK signal is generated. In FIG. 9, pulse 1022 is generated at output node 540 by propagation compensator 530. In some embodiments, propagation compensator 530 generates pulse 1022 by propagating pulse 1012 from input node 535 at time T2 to output node 540 at time T3. Since the interval 1020 between times T2 and T3 is referred to as the propagation interval, in some embodiments, pulse 1022 of the INT_CLK signal is generated by propagating pulse 1012 of the P_PULSE for the propagation interval. At time T3, edge 1023 of pulse 1022 is aligned with anticipated edge 1003 of the EXT_CLK signal.

At time T4, a subsequent propagation pulse 1014 is generated. Since the interval 1011 between times T2 and T4 is referred to as the reference interval, the subsequent propagation pulse 1014 is generated at the reference interval after the first propagation pulse 1012 is generated.

At time T5, pulse 1024 of the INT_CLK signal is generated. In FIG. 9, pulse 1024 is generated at output node 540 by propagation compensator 530. In some embodiments, propagation compensator 530 generates pulse 1024 by propagating pulse 1014 from input node 535 at time T4 to output node 540 at time T5. Since the interval 1020 between times T4 and T5 is also referred to as the propagation interval, in some embodiments, pulse 1024 of the INT_CLK signal is generated by propagating pulse 1014 of the P_PULSE for the same propagation interval. At time T5, edge 1025 of pulse 1024 is aligned with anticipated edge 1005 of the EXT_CLK signal.

In FIG. 10, initial interval 1010 corresponds to the initial value N1 (FIG. 9). Based on Formula 1, N1=R−nF−1=16−7−1=8. As shown in FIG. 10, pulse 1012 is generated eight cycles of the C_CLK signal after master pulse 1008 is generated.

Reference interval 1011 corresponds to N2 (FIG. 9). In the example above, N2 is 16. Thus, as shown in FIG. 10, the interval between two consecutive subsequent pulses 1012 and 1014 is 16 cycles of the C_CLK signal.

In FIG. 10, the value of propagation interval 1020 is a fixed value with reference to the core to bus ratio. In the example, the propagation interval 1020 includes seven cycles of the C_CLK signal.

Figure 11:
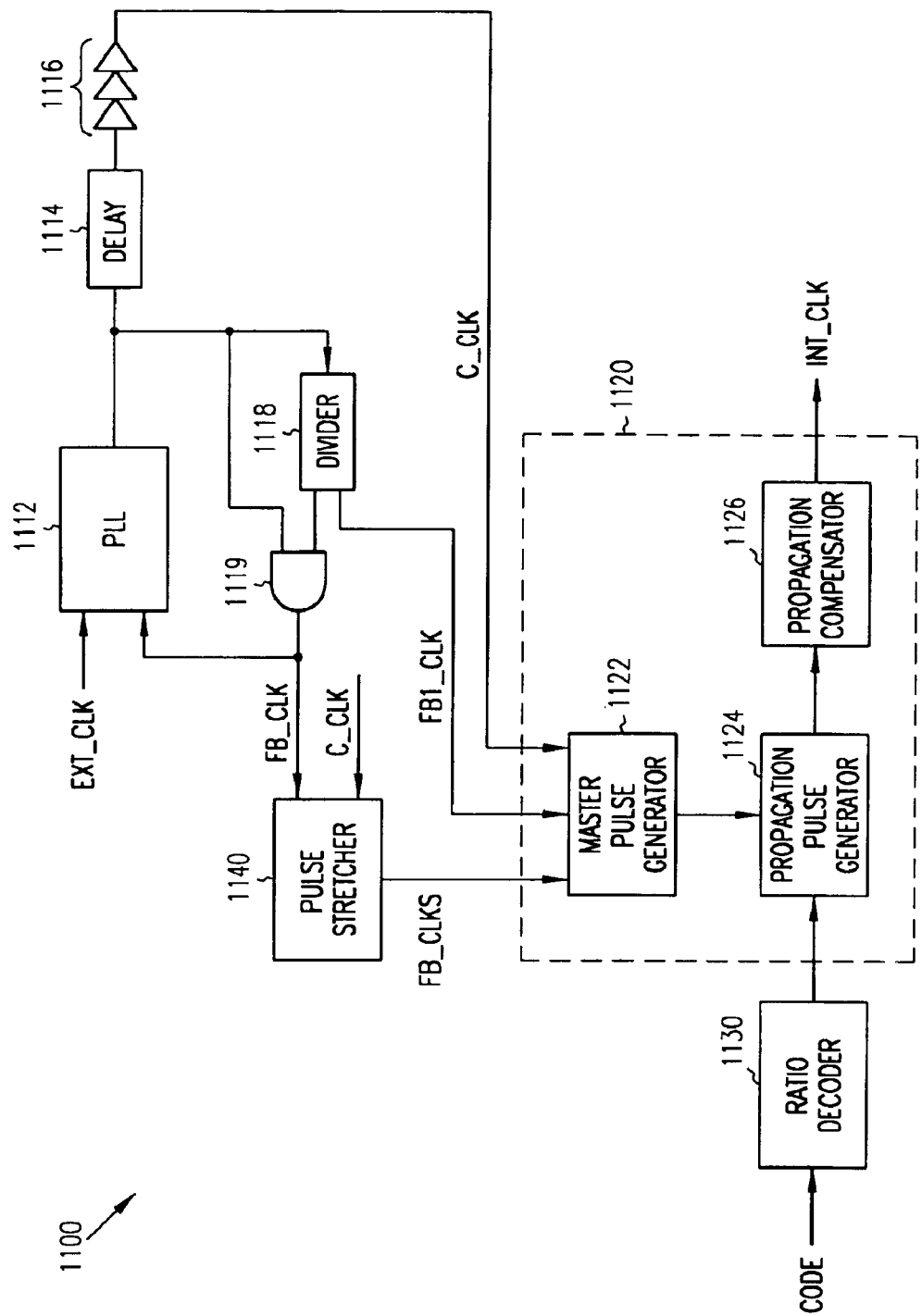
FIG. 11 shows another signal generator.

FIG. 11 shows another signal generator. Signal generator 1100 includes a PLL 1112, delay unit 1114, distribution network 1116, divider 1118, and AND gate 1119. An alignment unit 1120 includes a master pulse generator 1122, propagation pulse generator 1124, and an propagation compensator 1126. A ratio decoder 1130 couples to alignment unit 1120. A pulse stretcher 1140 couples between internal signal generator 1110 and alignment unit 1120.

Signal generator 1110 includes elements similar to the elements of signal generator 100 (FIG. 1). In FIG. 11, however, signal generator 1100 has a single PLL. PLL 1112 receives an external signal EXT_CLK and generates PLL signals FB_CLK, FB1_CLK, and C_CLK. These PLL signals are similar to those of the PLL signals of FIG. 1. Pulse stretcher 1140 stretches the FB_CLK signal to generate stretched signals FB_CLKS.

Pulse stretcher 1140 stretches a signal without affecting the interval between consecutive rising edges. The cycle time of the signal before and after the stretch remains unchanged. Thus, the FB_CLK and FB_CLKS signals have equal cycle time but the width of the pulse (high level portion of the signal) of the FB_CLKS signal is greater than the width of the pulse of the FB_CLK signal. In some embodiments, stretching the signal allows the generation of the INT_CLK signal to be more efficient.

Signal generator 1100 operates in a manner similar to that of signal generator 100 to align the INT_CLK and EXT_CLK signals.

Figure 12:
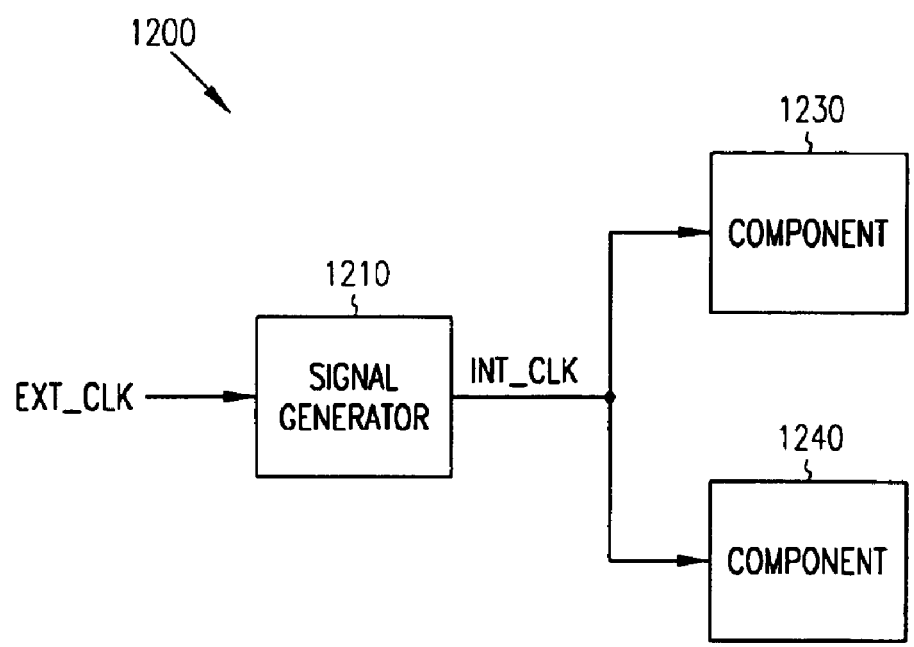
FIG. 12 shows an integrated circuit.

FIG. 12 shows an integrated circuit 1200. Integrated circuit 1200 may be any integrated circuit as a processor, a microprocessor, a memory device, a memory controller, a graphic controller, an instruction specific integrated circuit, or other types of integrated circuit. Integrated circuit 1200 includes a signal generator 1210 coupled to components 1230 and 1240.

Signal generator 1210 receives an external signal EXT_CLK and generates an internal signal INT_CLK. At components 1230 and 1240, the INT_CLK signal is synchronized with the EXT_CLK. Signal generator 1210 may be signal generator 100 (FIG. 1–FIG. 10) or signal generator 1100 (FIG. 11). Thus, signal generator 1210 includes elements similar to the elements of signal generator 100 and signal generator 1100.

Figure 13:
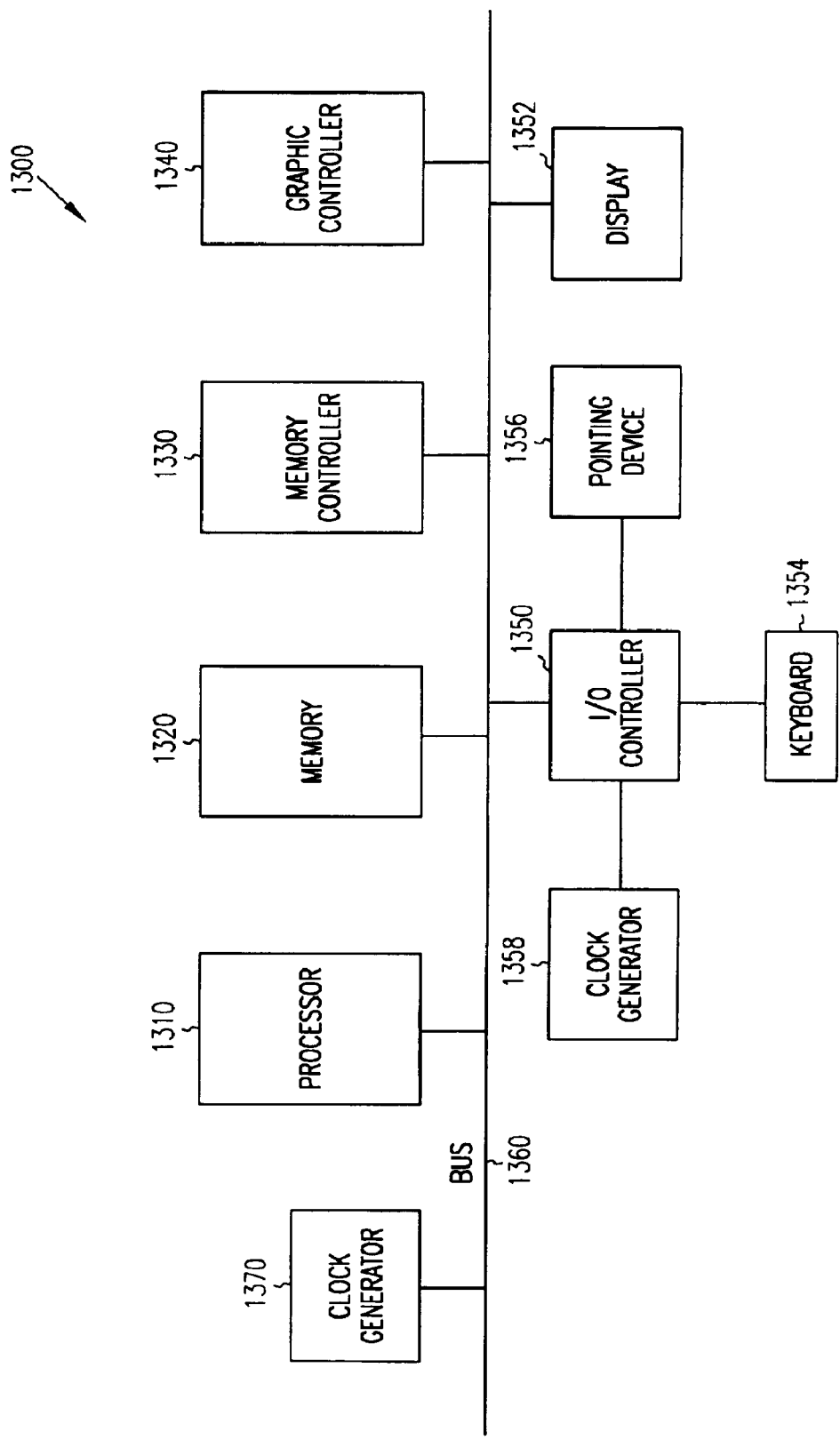
FIG. 13 shows a system.

FIG. 13 shows a system 1300. System 1300 includes a processor 1310, a memory device 1320, a memory controller 1330, a graphic controller 1340, and an input and output (I/O) controller 1350, a display 1352, a keyboard 1354, a pointing device 1356, and a peripheral device 1358. A bus 1360 couples all of these devices together. A clock generator 1370 provides an external signal EXT_CLK signal to at least one of the devices of system 1300 via bus 1360. An example of clock generator 1370 includes an oscillator in a circuit board such as a motherboard. Two or more devices shown in system 1300 may be formed in a single chip.

At least one of the devices shown in system 1300 includes an integrated circuit such as integrated circuit 1200 of FIG. 12. Further, at least one of the devices shown in system 1300 includes a signal generator such as signal generator 100 (FIG. 1–FIG. 10) and signal generator 1100 (FIG. 11).

Bus 1360 may be interconnect traces on a circuit board or may be one or more cables. Bus 1360 may also couple the devices of system 1300 by wireless means such as by electromagnetic radiations, for example, radio waves. Peripheral device 1358 may be a printer, an optical device such as CD-ROM and DVD reader and writer, a magnetic device reader and writer such as a floppy disk driver, or an audio device such as a microphone.

Memory device 1320 may be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), and Rambus DRAMs. Memory device 1320 may also be a static random access memory (SRAM) device, or may be a flash memory.

System 1300 represented by FIG. 13 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

What is claimed is:

1. A circuit comprising:

at least one phase lock loop to generate at least one core signal having multiple cycles within one cycle of an external signal;

a ratio decoder to decode a programming code; and an alignment unit coupled to the at least one phase lock loop and the ratio decoder, wherein the alignment unit includes a master pulse generator to generate a master pulse based on a combination of the at least one core signal and a modified copy of the external signal to synchronize a plurality of copies of the master pulse with the external signal based on the programming code.

2. The circuit of claim 1, wherein the ratio decoder includes a math unit to perform a math operation on the programming code.

3. A circuit comprising:

at least one phase lock loop to generate at least one core signal having multiple cycles within one cycle of an external signal;

a ratio decoder to decode a programming code; and an alignment unit coupled to the at least one phase lock loop and the ratio decoder to synchronize a plurality of propagation pulses with the external signal based on the programming code, wherein the alignment unit includes a master pulse generator to generate a master pulse having a pulse width equal to one cycle of the at least one core signal.

4. A circuit comprising:

at least one phase lock loop to generate at least one core signal having multiple cycles within one cycle of an external signal;

a ratio decoder to decode a programming code; and an alignment unit coupled to the at least one phase lock loop and the ratio decoder to synchronize a plurality of propagation pulses with the external signal based on the programming code, wherein the alignment unit includes a propagation pulse generator to periodically provide each of the propagation pulses to an propagation compensator of the alignment unit at a propagation interval before an occurrence of an anticipated edge of the external clock.

5. The circuit of claim 4, wherein the propagation pulse generator includes a counter and a reset unit coupled to the counter to reset the counter after a first propagation pulse among the plurality of propagation pulses is generated.

6. A circuit comprising:

at least one phase lock loop to generate at least one core signal having multiple cycles within one cycle of an external signal;

a ratio decoder to decode a programming code; and an alignment unit coupled to the at least one phase lock loop and the ratio decoder to synchronize a plurality of propagation pulses with the external signal based on the programming code, wherein the ratio decoder includes a math unit to perform a math operation on the programming code, wherein the ratio decoder further includes a selector to select between a control value represented by a programming code and a control value resulted from the math operation.

7. An integrated circuit comprising:
a phase lock loop network to receive an external signal to generate at least one core signal;
a master pulse generator to generate a master pulse based on a combination of the at least core signal and a modified version of the external signal;
a propagation pulse generator coupled to the master pulse generator to generate a plurality of propagation pulses based on the master pulse;
an propagation compensator coupled to the propagation pulse generator to propagate the plurality of propagation pulses for a propagation interval to generate an internal clock signal; and
a ratio decoder coupled to the propagation pulse generator to provide at least one control value to influence a timing of the plurality of propagation pulses.

8. The integrated circuit of claim 7, wherein the master pulse generator includes a logic unit to enable a pulse width of the master pulse to be one cycle of the at least one core signal.

9. The integrated circuit of claim 8, wherein the master pulse generator further includes a reset unit to reset the master pulse generator.

10. The integrated circuit of claim 7, wherein the propagation pulse generator includes a counter coupled to the master pulse generator.

11. The integrated circuit of claim 10, wherein the counter is a ring counter.

12. The circuit of claim 7, wherein the ratio decoder includes a logic circuit to perform a subtraction operation on the at least one control value.

13. The circuit of claim 12, wherein the ratio decoder further includes a selector to select the at least one control value.

14. The integrated circuit of claim 7, wherein the propagation compensator includes a plurality of flip-flops coupled in series between an output node of the propagation pulse generator and an output node of the propagation compensator.

15. The integrated circuit of claim 7 further comprising at least one component coupled to the propagation compensator to receive the internal clock signal.

16. A system comprising:
a clock generator to generate an external signal;
a dynamic random access memory device coupled to receive the external signal; and
a plurality of integrated circuits coupled to receive the external signal, at least one of the plurality of integrated circuits including:
an internal signal generating unit to generate at least one core signal;
a ratio decoder to decode a programming code; and
an alignment unit coupled to the internal signal generating unit and the ratio decoder, wherein the alignment unit includes a master pulse generator to generate a master pulse based on a combination of the at least one core signal and a modified copy of the external signal to synchronize a plurality of copies of the master pulse with the external signal based on the programming code.

17. The system of claim 16, wherein one of the integrated circuit includes a processor.

18. The system of claim 16, wherein the ratio decoder includes a logic unit to perform a math operation on the programming code.

19. A system comprising:
a clock generator to generate an external signal;
a dynamic random access memory device coupled to receive the clock generator; and
a plurality of integrated circuits coupled to receive the external signal, at least one of the plurality of integrated circuits including:
an internal signal generating unit to generate at least one core signal;
a ratio decoder to decode a programming code; and
an alignment unit coupled to the internal signal generating unit and the ratio decoder to synchronize a plurality of propagation pulses with the external signal based on the programming code, wherein the internal signal generating unit includes multiple phase lock loops coupled in a cascaded configuration.

20. A system comprising:
a clock generator to generate an external signal;
a dynamic random access memory device coupled to receive the clock generator; and
a plurality of integrated circuits coupled to receive the external signal, at least one of the plurality of integrated circuits including:
an internal signal generating unit to generate at least one core signal;
a ratio decoder to decode a programming code; and
an alignment unit coupled to the internal signal generating unit and the ratio decoder to synchronize a plurality of propagation pulses with the external signal based on the programming code, wherein the alignment unit includes a master pulse generator to generate a master pulse having a pulse width equal to at least one cycle of the at least one core signal.

21. A system comprising:
a clock generator to generate an external signal;
a dynamic random access memory device coupled to receive the clock generator; and
a plurality of integrated circuits coupled to receive the external signal, at least one of the plurality of integrated circuits including:
an internal signal generating unit to generate at least one core signal;
a ratio decoder to decode a programming code; and
an alignment unit coupled to the internal signal generating unit and the ratio decoder to synchronize a plurality of propagation pulses with the external signal based on the programming code, wherein the alignment unit includes a propagation pulse generator to periodically provide each of the propagation pulses to an propagation compensator of the alignment unit at a propagation interval before an occurrence of an anticipated edge of the external clock.

22. A system comprising:
a clock generator to generate an external signal;
a dynamic random access memory device coupled to receive the clock generator; and
a plurality of integrated circuits coupled to receive the external signal, at least one of the plurality of integrated circuits including:
an internal signal generating unit to generate at least one core signal;
a ratio decoder to decode a programming code; and
an alignment unit coupled to the internal signal generating unit and the ratio decoder to synchronize a plurality of propagation pulses with the external signal based on the programming code wherein the ratio decoder includes a logic unit to perform a math operation on the programming code, wherein the ratio decoder further includes a selector to select between a control value represented by a programming code and a control value resulted from the math operation.

23. A method comprising:

generating a core signal based on an external signal, the core signal having core cycles;

producing a master pulse based on a combination of the core signal and a modified version of the external signal;

producing a plurality of propagation pulses including a first propagation pulse and a group of subsequent propagation pulses, wherein the first propagation pulse is produced at an initial interval after the master pulse is produced; and propagating the plurality of propagation pulses for a propagation interval to align the plurality of propagation pulses with the external signal.

24. The method of claim 23 further comprising setting a reference value, wherein the reference value represents a number of the core cycles within one cycle of the external signal.

25. The method of claim 23, wherein the master pulse has a pulse width, wherein the pulse width equals an interval between two consecutive rising edges of the core signal.

26. The method of claim 23, wherein the initial interval is a variable value.

27. The method of claim 23, wherein the propagation interval is an interval between an occurrence of one of the propagation pulses and an occurrence of an anticipated edge of the external clock signal.

28. The method of claim 23, wherein the initial interval includes a number of initial core cycles, wherein the number of initial core cycles is less than a number of core cycles within one cycle of the external clock signal.

29. The method of claim 28, wherein each of the subsequent propagation pulses is produced at a multiple of the number of core cycles within one cycle of the external clock after the first propagation pulse is produced.

* * * * *